United States Patent [19]

Egle

[11] 4,194,116
[45] Mar. 18, 1980

[54] ELECTRON MICROSCOPE OR THE LIKE AND METHOD OF USE

[75] Inventor: Wilhelm Egle, Konigsbronn, Fed. Rep. of Germany

[73] Assignee: Carl Zeiss-Stiftung, Oberkochen, Fed. Rep. of Germany

[21] Appl. No.: 943,579

[22] Filed: Sep. 18, 1978

[30] Foreign Application Priority Data

Sep. 20, 1977 [DE] Fed. Rep. of Germany ....... 2742264

[51] Int. Cl.² .......................................... G01M 23/00
[52] U.S. Cl. ................................. 250/311; 250/396 R
[58] Field of Search ............................... 250/311, 396

[56] References Cited

U.S. PATENT DOCUMENTS

2,494,442  1/1950  Le Poole .............................. 250/311

Primary Examiner—Harold A. Dixon
Attorney, Agent, or Firm—Hopgood, Calimafde, Kalil, Blaustein & Lieberman

[57] ABSTRACT

The invention contemplates method and means for using an electron microscope in conjunction with a projection system whereby the microscope produces a distortion-corrected image of an object at a relatively low magnification level, the distortion-corrected image being at the object plane of the projection system, whereby magnification may be varied in accordance with excitation of the projection system, and whereby a delicate object specimen may be fixedly positioned and exposed to large-area low-level illuminating flux within the objective lens system of the microscope.

12 Claims, 4 Drawing Figures

ELECTRON MICROSCOPE OR THE LIKE AND METHOD OF USE

The present invention involves a method for obtaining the image of an object with low magnification by means of a corpuscular radiation device, particularly an electron microscope, in which the object is illuminated by a condenser system behind which is a condenser diaphragm, the position of the object remaining the same regardless of the chosen magnification, and in which the final image is produced on a screen by means of an objective lens, an intermediate lens, and a projection system, as well as an image diaphragm (zone diaphragm) placed between the objective and intermediate lenses.

In addition to obtaining a high-resolution image of object details with increased magnification, it is often desirable to use an electron microscope for accurate photography of large-surfaced objects at low magnification (less than 100×) with optimum informational content and the least possible distortion.

Such valuable photography of large objects at lower magnification is especially important for obtaining coherent, faithful reproductions of large cells or large tissue sections, for example. This kind of reproduction could otherwise be made only by expensive and time-consuming assembly of many detail pictures of average or higher magnification, involving problems in image distortion, magnification blurring, and contrast. Such difficulties are especially annoying in three-dimensional image construction of a number of contiguous picture elements.

It is desirable that the electron-image quality of a large object made at relatively low magnification be such that picture resolution is better than film-grain resolution, so that with enlargement of the electron image or a selected portion thereof, there will be no loss of detail for film negative made from the electronically enlarged image.

German Pat. No. 2,326,042 discloses a method of obtaining the image of an object with good contrast and low magnification, in which the image undergoes no change with reduced magnification. In this method, the picture is taken at low magnification with the objective lens switched off, and the image is obtained with the intermediate lens under low-level excitation. At the same time, the condenser system is so adjusted that the crossover point of the electron beam is in the zone diaphgram situated in front of the intermediate lens. In order to obtain the image of a larger object, the condenser diaphragm must be replaced by a diaphragm with a diameter of at least 0.5 mm.

The basic disadvantage of this known method is that, as a result of the converging illuminating cone with ordinary distances of the lenses, the diameter of the illuminated-object plane corresponds to only about half the diameter of the condenser diaphragm used. Thus, with a condenser diaphragm of 0.5-mm diameter, for example, only a 250-$\mu$m object-plane illumination diameter can be obtained. An object-plane illumination with a diameter of more than 1 mm can only be had with a very distant condenser diaphragm. In that case, however, the total radiation load on the object is so high that, even at the lowest radiation intensity level, sensitive specimens will suffer thermal damage.

A further disadvantage of the known method is that, as a result of the lower excitation of the intermediate lens, the image will suffer from marked distortion and field curvature, becoming extreme at the lowest magnifications. Besides, with the objective lens switched off, a further adjustment of the illumination direction into the axis of the first projection lens is required.

The purpose of the present invention is to provide a method of producing an electron-microscope image of an object at low magnification with a large object field and minimum load on the object, and having excellent quality in addition to high contrast.

This aim is achieved through a corpuscular radiation device, in particular an electron microscope of the character described above, but in which the objective lens is switched on and is given a low excitation enabling it to form, together with the intermediate lens, an optimum, distortion-corrected image in the object plane of the following projection system, and the excitation given the condenser system is such that the crossover point it produces of the rays emitted by the radiation source is in or near the plane of the condenser diaphragm, the position and opening of which remain unchanged with increased magnification during operation of the electron microscope, and this crossover point is formed by the objective lens as a real image in the image-diaphragm plane.

The new method employs the well-known principle (J. Hillier, in the *Journal of Applied Physics*, vol. 17, No. 6, June 1946) that the pillow-shaped radial distortion of an image-forming lens can be reduced to a practically negligible minimum, by the insertion of a second lens forming a virtual image for a definite operation point. To obtain such correction, the objective lens is in the new method given an excitation level such that a low-magnification virtual image is produced, and the intermediate lens is used to form the virtual image into a real image, at the screen of the following projection system. The excitation of the objective lens is held constant, the excitation of the intermediate lens is generally variable within narrow limits for fine adjustment of the image, and the excitation of the projection system is varied in order to change the image magnification.

In the new method, the object is illuminated by a diverging cone of rays through excitation of the condenser system. Consequently, there is no cutout of part of the object field—i.e., condenserplane location, normally subject to adjustment in high-magnification usage, need not be changed in making the transition to lower magnification. It is especially advantageous if the condenser system is given such excitation levels as to place the crossover point of the illumination rays in the plane of the condenser diaphragm. Regardless of the magnification chosen, the positions of the condenser diaphragm and of the image diaphragm are such that these diaphragms are conjugate with respect to an objective lens which is excited to keep distortion to a minimum.

Through the new method, one can obtain divergent object illumination, independent of the diameter of the condenser diaphragm opening, for diaphragm openings up to 2 mm in diameter, with very small illuminating apertures of $10^{-5}$ to $10^{-6}$ rad. The load on the object is thus 1/100 of the convergent illumination in the known method. This permits the use of a whole array of different materials that can safely be used as objects in the new method at low magnification.

The new method does not require correction of the illumination direction by means of additional deflection systems since, because in th broad-surfaced illumination of the object (even with obliquely incident lighting), none of the object field is cut off.

In the new method, use of a small diaphragm makes it possible to set the image aperture to about $1 \times 10^{-4}$ rad. With this and the described excitation of the imaging lens, a contrasty, useful image can be obtained for object fields as large as 2 mm in diameter.

By means of the new method, it is possible so to drive an operating electron microscope as to use the fixed-focus technique of photography. Thus, on the whole, the object can be changed without the need for refocusing the intermediate lens in the magnification range considered (e.g. $100\times$ to $1000\times$). Such an electron microscope is distinguished in that the image aperture is chosen to be $\leq 10^{-4}$ rad., and the object remains exactly reproducible even with an objectpositional change of about $\leq 0.2$ mm. The following example will make this clearer.

If the image resolution is 200 Å with an image aperture of $1 \times 10^{-4}$ rad., the depth of definition of the object dimension is about 0.2 mm. The fineness of the grain is approximately 20 μm for normal small-frame film, which for a 200 Å object resolution, yields a final image magnification of $M=1000\times$; for $M=100\times$, the permissible object dimension blur circle is $10\times$ greater, i.e., the position of the object may vary by about 2 mm, given the same image aperture and film grain size, with no noticeable blurring. Thus, if the object is to be reproduced with a tolerance of about 0.2 mm, a correctly focused image is possible in the whole range of magnification (e.g., between $1000\times$ and $100\times$) without refocusing the intermediate lens.

The invention can better be explained in reference to the accompanying drawings, in which.

Figure 1:
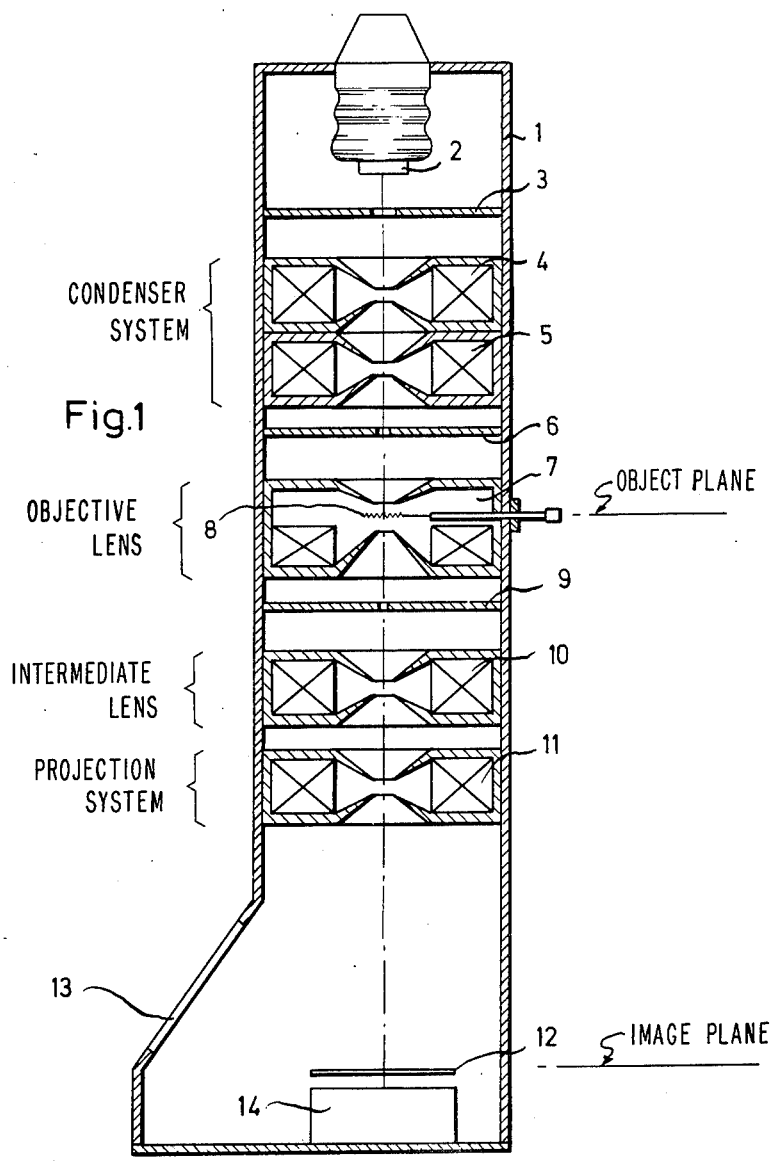
FIG. 1 is a longitudinal sectional view schematically showing an electron microscope using the method of the invention.

In FIG. 1, an electron microscope 1 is indicated, with an electron-emitting cathode 2 and an accelerating electrode 3. The condenser lenses labeled 4 and 5 comprise the condenser system. The condenser diaphragm is shown as 6. The object 8 to be reproduced is inside the objective lens 7 and is removable. The image diaphragm 9 working as a zone diaphragm at high magnifications is connected with the objective lens 7. The intermediate lens is designated as 10, and the following projection system is designated as 11, the latter shown only as a single lens. These lenses produce an image of the object 8 on the screen 12, which can be observed through window 13 in the housing of 1. Under the screen 12 is the schematically indicated camera 14 for photographing the object.

Figure 2:
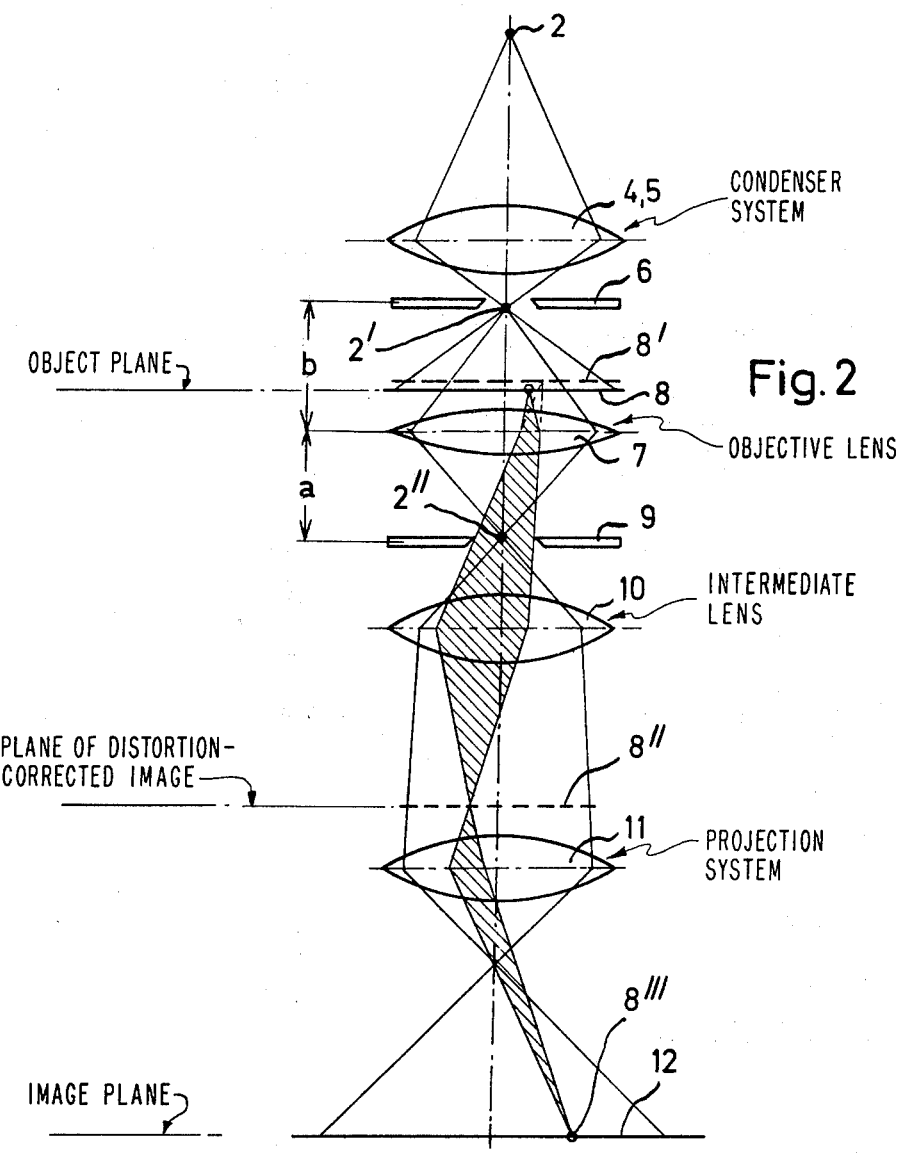
FIG. 2 is a ray diagram showing ray paths in the electron microscope of FIG. 1 and illustrating production of an image with low magnification.

The diagram of FIG. 2 schematically shows operation of the electron microscope, the image of object 8 being produced on screen 12 with low magnification.

The objective lens 7 and the intermediate lens 10 are given excitations such that they will together produce the distortion-corrected image 8" of object 8 in the object plane of the projection system 11. The excitation of the objective lens 7 is held constant and excitation of the intermediate lens 10 is variable within narrow limits, to focus the image sharply. The excitation of the projection system 11 is variable, enabling the system to produce the image 8''' of object 8 on the final image screen 12 at the desired magnification.

The condenser system 4,5 is excited such that an image 2' of the radiation source 2 is produced in the plane of the condenser diaphragm 6. This diaphragm is varied in position or in aperture during operation of the electron microscope at high magnifications. The object 8 is illuminated by a diverging cone so that the diaphragm 6 cuts out none of the illuminated object field.

The image of the condenser diaphragm 6 is brought by the distortion-corrected lens 7 into the zone diaphragm 9. In FIG. 2 the values of a and b, the distances of these diaphragms from the objective lens 7, are such that $1/a + 1/b = 1/f_o$, where $f_o$ is the focal length of the objective lens 7.

Figure 3:
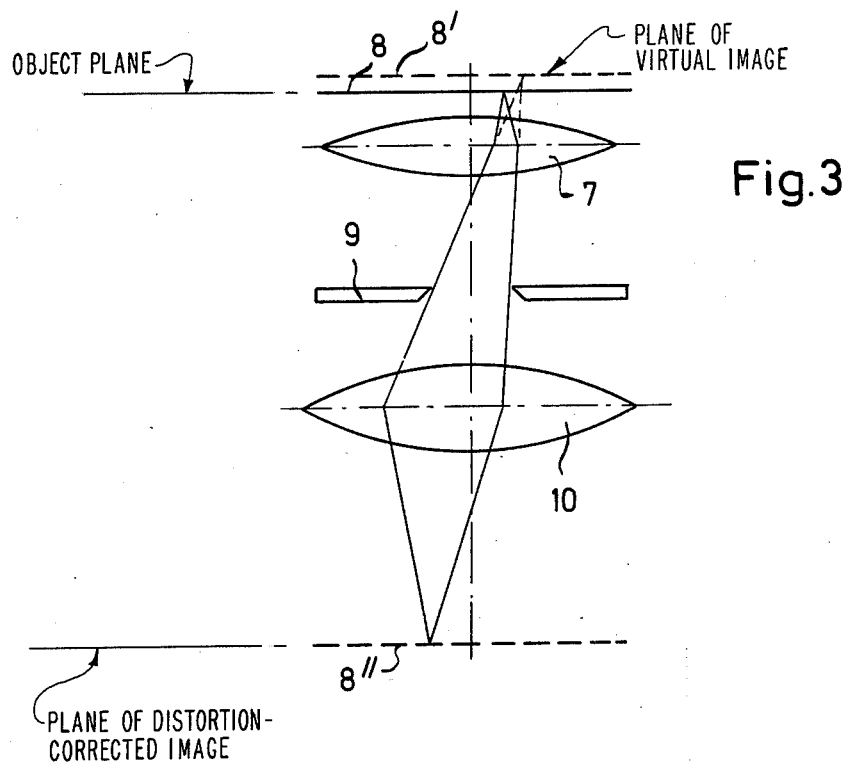
FIG. 3 is an enlarged fragmentary view of ray paths between the object and the projection system of FIG. 1.

A detailed representation of how the optimum distortion-corrected image is produced by the cooperation of objective lens 7 and the intermediate lens 10 is given in FIG. 3. The image aperture depends on the diameter of the diaphragm 9 and its distance from the virtual image 8'. With a distance of about 100 mm and a diaphragm aperture diameter (9) of 0.02 mm, the illumination aperture is $1 \times 10^{-4}$ rad. At such low aperture angles, the lens aberrations are practically negligible such that high-quality pictures can be obtained of objects with large surfaces at low magnification.

Figure 4:
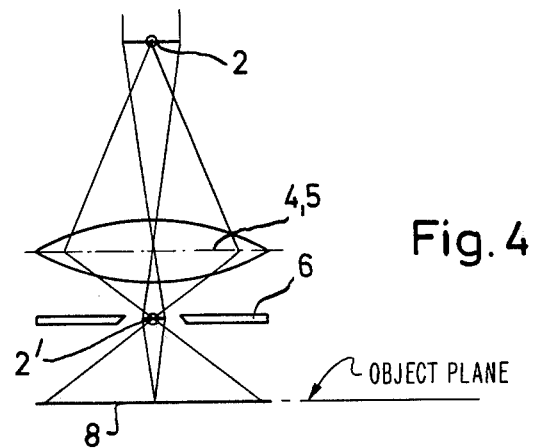
FIG. 4 is another fragmentary diagram to show application of radiation illumination between the radiation source and the condenser diaphragm.

It is best to excite the condenser system 4,5 to obtain the result of FIG. 4. In this case, the system produces an image 2' of the radiation source 2 in the plane of the condenser diaphragm 6. As we know, the object 8 is illuminated by a divergent cone of rays in FIG. 4 as it is in FIG. 2—i.e., the whole of the large surface of object 8 is illuminated, with no limiting shadow cast by the condenser diaphragm 6. In the application example of FIG. 4, the diaphragm 6 cannot cut off any illumination since the crossover point of the illuminating rays lies precisely in the plane of this diaphragm.

Illumination apertures of $10^{-5}$ rad., for example, are available even with simple condenser operation—i.e., with the first condenser lens switched off; with both condensers 4 and 5 under excitation, illumination apertures of less than $10^{-6}$ rad. are possible. This permits a whole range of object materials to be observed at low magnification, with the lowest possible thermal load on the object 8.

Through this type of operation of the electron microscope, low magnification of up to $100\times$ can be obtained, in which an object 8 of relatively large surface area can be illuminated with minimum intensity, and the pictures produced at screen 12 are of high quality with good contrast.

What is claimed is:

1. A method of reproducing the image of an object with low magnification by means of a corpuscular radiation device, in particular an electron microscope, in which the object, whose position remains the same regardless of the magnification chosen, is illuminated by a condenser system behind which is a condenser diaphragm, and in which the final image is produced on a screen by means of an objective lens, an intermediate lens, and a projection system, as well as an image diaphragm (zone diaphragm) placed between the objective and intermediate lenses, distinguished in that the objective lens is switched on and is given a low level of excitation enabling it to form, together with the intermediate lens, an optimum, distortion-corrected image of the object in the object plane of the following projection system, and that the condenser system is excited such that the crossover point of the rays emitted by the radiation source is between the object and the last condenser lens in or near the plane of the condenser diaphragm, whose position and opening remain unchanged with increased magnification, during the adjustment of the electron microscope, and that this crossover point is real and is formed in the plane of the image diaphragm by the objective lens.

2. The method of claim 1, distinguished in that the objective and intermediate lenses are excited such that together they form the image of the object in the object plane of the following projection system with optimum distortion correction.

3. The method of claims 1 or 2, distinguished in that the excitation of the projection system is varied to change the magnification of the image.

4. The method of claim 1, distinguished in that the crossover point of the illuminating rays is produced in the plane of the condenser diaphragm by the condenser system.

5. The method of claim 1 and one or more of the following, distinguished in that the diameter of the opening in the condenser diaphragm is chosen to be less than 500 μm.

6. The method of claim 5, distinguished in that the illumination aperture is chosen less than $10^{-5}$ rad.

7. The corpuscular radiation device for accomplishing the method of claim 1, distinguished in that the position of the condenser diaphragm and the image diaphragm is chosen such that they are conjugate with the excitation of the objective lens to produce a distortion-corrected image.

8. The corpuscular radiation device of claim 7, distinguished in that to avoid refocusing of the intermediate lens with a change of object, the image aperture is chosen $\leq 10^{-4}$ rad., and the object is exactly reproducible with a change in the position of the object by $\leq 0.2$ mm.

9. The method of using an electron microscope in which an object is fixedly positioned for a range of selectable magnification and is illuminated by an electron source via a condenser system and via a condenser diaphragm, and in which a final image is produced on a screen by means of an objective lens and an intermediate lens and by a projection system, with an image diaphragm interposed between the objective and intermediate lenses, said method comprising exciting the objective lens at such a low level as to enable it to form via the intermediate lens a distortion-corrected image of the object in the object plane of the projection system, the condenser system being excited to place the crossover point of source-emitted rays in or near the plane of the condenser diaphragm, and the condenser diaphragm and the image diaphragm being so positioned with respect to the objective lens that said crossover point is imaged by the objective lens in the plane of the image diaphragm.

10. The method of claim 9, in which excitation of the projection system is varied to change the magnification of the image at the screen.

11. An electron microscope comprising, in serially disposed array along its operating axis, an electron source, a condenser system, a condenser diaphragm, an objective lens with means for supporting an object therein, an image diaphragm, an intermediate lens, and a projection system including a screen for display of a projected image, the position of the condenser system being such with respect to the source and with respect to the condenser diaphragm that the condenser system may be excited to place the crossover point of source-emitted rays in or near the plane of the condenser diaphragm, whereby the object may be illuminated by divergent rays from the condenser diaphragm, the objective and intermediate lenses being so positioned with respect to the image diaphragm as to enable low-magnification excitation of the objective lens and corrective excitation of the intermediate lens to produce a distortion-corrected image of the object at the object plane of the projection system, and the condenser diaphragm and the image diaphragm being so positioned with respect to the objective lens that said crossover point is imaged by the objective lens in the plane of the image diaphragm.

12. The electron microscope of claim 11, in which the condenser diaphragm and the image diaphragm are at conjugate positions with respect to the objective lens.

* * * * *